(12) United States Patent
Yasukawa

(10) Patent No.: US 7,662,704 B2
(45) Date of Patent: Feb. 16, 2010

(54) ELECTRO-OPTICAL DEVICE, METHOD OF MANUFACTURING THE SAME, ELECTRONIC APPARATUS, AND SEMICONDUCTOR DEVICE

(75) Inventor: Masahiro Yasukawa, Chino (JP)

(73) Assignee: Seiko Epson Corporation, Tokyo (JP)

( * ) Notice: Subject to any disclaimer, the term of this patent is extended or adjusted under 35 U.S.C. 154(b) by 445 days.

(21) Appl. No.: 11/539,466

(22) Filed: Oct. 6, 2006

(65) Prior Publication Data

US 2007/0087534 A1 Apr. 19, 2007

(30) Foreign Application Priority Data

Oct. 7, 2005 (JP) ............................... 2005-294429

(51) Int. Cl.
  H01L 21/20 (2006.01)
  H01L 21/36 (2006.01)
  H01L 29/10 (2006.01)
  H01L 29/76 (2006.01)
  H01L 31/112 (2006.01)
  H01L 27/108 (2006.01)
  H01L 29/00 (2006.01)

(52) U.S. Cl. ........................... 438/489; 257/67; 257/69; 257/E21.133

(58) Field of Classification Search ................. 438/489; 257/67, 69, E21.133; 117/8
See application file for complete search history.

(56) References Cited

U.S. PATENT DOCUMENTS

| 4,902,642 | A | * | 2/1990 | Mao et al. ................... 438/480 |
| 6,828,179 | B2 | | 12/2004 | Yamazaki et al. |
| 7,186,630 | B2 | * | 3/2007 | Todd .......................... 438/478 |
| 7,196,400 | B2 | | 3/2007 | Yamazaki et al. |
| 2003/0164513 | A1 | * | 9/2003 | Ping et al. ................... 257/288 |
| 2005/0227421 | A1 | * | 10/2005 | Pawlak ....................... 438/151 |

FOREIGN PATENT DOCUMENTS

| JP | A-63-055529 | | 3/1988 |
| JP | 05134272 | * | 5/1993 |
| JP | A 05-134272 | | 5/1993 |
| JP | A 2001-255559 | | 9/2001 |
| JP | A-2003-115457 | | 4/2003 |

* cited by examiner

*Primary Examiner*—David S Blum
*Assistant Examiner*—Daniel Luke
(74) *Attorney, Agent, or Firm*—Oliff & Berridge, PLC

(57) ABSTRACT

An electro-optical device includes: a substrate; a plurality of pixel units provided in a display region on the substrate; and a driving circuit that is provided in a peripheral region surrounding the display region and includes semiconductor elements that drive the plurality of pixel units, each of the semiconductor elements having a first semiconductor layer and a second semiconductor layer. The first semiconductor layer has an SOI (silicon on insulator) structure including a first single crystal silicon layer, and the second semiconductor layer is formed of a second single crystal silicon layer that is formed on the first semiconductor layer by epitaxial growth.

1 Claim, 11 Drawing Sheets

ELECTRO-OPTICAL DEVICE, METHOD OF MANUFACTURING THE SAME, ELECTRONIC APPARATUS, AND SEMICONDUCTOR DEVICE

BACKGROUND

1. Technical Field

The present invention relates to an electro-optical device such as a liquid crystal device, to a method of manufacturing the same, to an electronic apparatus having the electro-optical device, such as a liquid crystal projector, and to a semiconductor device.

2. Related Art

In electro-optical devices, such as a liquid crystal device, a structure in which display pixels and driving circuits are simultaneously formed on the same substrate is used. In the above-mentioned structure, a serious problem does not occur even if an element characteristic, such as a transistor characteristic, of a semiconductor element that is provided at a display pixel and mainly performs a relatively low-speed switching operation is relatively low; however, an element characteristic of a semiconductor element that performs a relatively high-speed switching operation, a current amplification operation, a current control operation, a rectification operation, or a voltage holding operation in a driving circuit is required to be excellent. For this reason, there are disclosed various techniques in which single crystal silicon is used as a semiconductor layer of a semiconductor element of a driving circuit and polysilicon is used as a semiconductor layer of a semiconductor element of a display pixel. For example, a method of efficiently forming different kinds of semiconductor layers on the same substrate is disclosed in JP-A-5-134272. Specifically, JP-A-5-134272 discloses a technique in which a semiconductor layer is formed by growing a silicon layer with a silicon nitride layer as a seed layer and then it is determined whether the silicon layer to be deposited will be a polycrystalline silicon layer or a single crystal silicon layer by differently setting the size of the silicon nitride layer serving as the seed layer. Further, a method of converting a single crystal silicon layer to polysilicon is disclosed in JP-A-2001-255559. Specifically, JP-A-2001-255559 discloses a method of converting the single crystal silicon layer to polysilicon by injecting silicon ions into the single crystal silicon layer and then performing heat treatment, laser annealing, or the like.

However, in the technique disclosed in JP-A-5-134272, it is difficult to obtain a silicon layer having a sufficiently smooth surface, which causes a technical problem in which a planarization process, such as a CMP (chemical mechanical polishing), is additionally required. In addition, since it is difficult to grow the silicon layer from the seed layer, a technical problem occurs in that it is difficult to put the technique disclosed in JP-A-5-134272 to practical use. Furthermore, in the technique disclosed in JP-A-2001-255559, a technical problem occurs in that it is difficult to convert the single crystal silicon layer to polysilicon by injection of silicon ions.

SUMMARY

An advantage of some aspects of the invention is that it provides an electro-optical device in which a semiconductor layer formed of polysilicon can be easily formed in a display region and a semiconductor layer formed of a flat single crystal silicon layer can be easily formed in a peripheral region, a method of manufacturing the same, an electronic apparatus, and a semiconductor device.

According to a first aspect of the invention, an electro-optical device includes: a substrate; a plurality of pixel units provided in a display region on the substrate; and a driving circuit that is provided in a peripheral region surrounding the display region and includes semiconductor elements that drive the plurality of pixel units, each of the semiconductor elements having a first semiconductor layer and a second semiconductor layer. The first semiconductor layer has an SOI (silicon on insulator) structure including a first single crystal silicon layer, and the second semiconductor layer is formed of a second single crystal silicon layer that is formed on the first semiconductor layer by epitaxial growth.

In the electro-optical device according to the above-mentioned aspect, while the electro-optical device is operating, image signals and scanning signals are supplied to the pixel units through, for example, data lines and scanning lines by means of driving circuits, such as a data line driving circuit and a scanning line driving circuit, disposed in the peripheral region. These image signals and the like are selectively supplied from semiconductor elements, such as pixel switching transistors, to display electrodes, such as pixel electrodes, in the pixel units, and thus active matrix driving is performed. That is, image display is performed in the display region or a pixel array region (also called an 'image display region') in which the plurality of pixel units are arrayed in a matrix.

In the invention, the semiconductor element, such as a thin film transistor, forming the driving circuit has a two-layered structure including the first semiconductor layer and the second semiconductor layer. The first semiconductor layer has an SOI structure including the first single crystal silicon layer. That is, the first semiconductor layer is formed of the first single crystal silicon layer that is formed on an insulating layer by an SOI technique, the first single crystal silicon layer having good crystallinity or considerably uniform layer thickness. The second semiconductor layer is formed of the second single crystal silicon layer that is formed on the first semiconductor layer (that is, the first single crystal silicon layer) by the epitaxial growth. Specifically, for example, the second single crystal silicon layer is formed by stacking amorphous silicon on the first semiconductor layer and then by growing the stacked amorphous silicon in the solid state by means of heat treatment. Thus, since the semiconductor element forming the driving circuit has the two-layered structure, it is possible to make the width of a depletion layer of the first semiconductor layer smaller than that of the second semiconductor layer, for example, by making the impurity concentration (that is, carrier concentration) of the first semiconductor layer higher than that of the second semiconductor layer. Accordingly, due to the first semiconductor layer having a layer thickness smaller than the second semiconductor layer, it is possible to implement a partial-depletion-mode semiconductor element. As a result, it is possible to increase the operation speed of the driving circuit. Further, it is possible to reduce the scattering of carriers in the second semiconductor layer by making the impurity concentration (that is, carrier concentration) of the second semiconductor layer lower than that of the first semiconductor layer. Accordingly, the mobility of carriers can be increased. As a result, it is possible to further increase the operation speed of the driving circuit.

As described above, according to the electro-optical device of the invention, each of the semiconductor elements forming the driving circuit has the two-layered structure including the first semiconductor layer, which has the SOI structure, and the second semiconductor layer, which is formed by the epitaxial growth. Therefore, it is possible to improve the performance, such as the operation speed, of the driving circuit by adjusting the impurity concentration of each of the first semiconductor layer and the second semiconductor layer.

In the electro-optical device according to the above-mentioned aspect, preferably, each of the plurality of pixel units has a semiconductor element that is electrically connected to the driving circuit and has at least a third semiconductor layer formed of a polysilicon layer.

In the invention, the semiconductor element, such as a pixel switching thin film transistor, provided in each of the pixel units has at least the third semiconductor layer formed of a polysilicon layer. Accordingly, in the pixel units, it is possible to shorten the lifetime of carriers accumulated in a channel region of the third semiconductor layer, as compared with a case in which the semiconductor layer is formed of, for example, a single crystal silicon layer. As a result, it is possible to reduce or prevent an off-leakage current that is easily generated by optical illumination and is generated due to long lifetime of carriers. In addition, since each of the semiconductor elements forming the driving circuit has the two-layered structure including the first semiconductor layer, which has the SOI structure, and the second semiconductor layer, which is formed by the epitaxial growth, it is possible to improve the performance, such as the operation speed, of the driving circuit by adjusting the impurity concentration of each of the first semiconductor layer and the second semiconductor layer.

Further, according to another aspect of the invention, there is provided an electronic apparatus including the electro-optical device described above.

Since the electronic apparatus of the invention is configured to have the above-described electro-optical device of the invention, various electronic apparatuses, such as a projection type display device, a television, a mobile phone, an electronic note, a word processor, a view finder type or monitor direct view type video tape recorder, a workstation, a video phone, a POS terminal, or a touch panel, which are capable of displaying high-quality images, can be implemented. Further, an electrophoresis device such as an electronic paper, a field emission display device and a conduction electron-emitter display device, and a display device using the electrophoresis device, the field emission display device, or the conduction electron-emitter display device can be implemented by using the electronic apparatus of the invention.

Furthermore, according to still another aspect of the invention, there is provided a method of manufacturing an electro-optical device having a substrate, a plurality of pixel units provided in a display region on the substrate, and a driving circuit that is provided in a peripheral region surrounding the display region and includes semiconductor elements that drive the plurality of pixel units. The method includes: forming each of the semiconductor elements having first and second semiconductor layers by forming the first semiconductor layer in at least a region where each of the semiconductor elements is to be disposed and then forming the second semiconductor layer on the first semiconductor layer, the first semiconductor layer having an SOI structure and formed of a first single crystal silicon layer and the second semiconductor layer being formed of a second single crystal silicon layer by epitaxial growth; and forming the plurality of pixel units in the display region.

By using the method of manufacturing an electro-optical device, the above-described electro-optical device can be manufactured. Here, in particular, since it is possible to manufacture each of the semiconductor elements forming the driving circuit so as to have the two-layered structure including the first semiconductor layer, which has the SOI structure, and the second semiconductor layer, which is formed by the epitaxial growth, it is possible to improve the performance, such as the operation speed, of the driving circuit by adjusting the impurity concentration of each of the first semiconductor layer and the second semiconductor layer.

In the method of manufacturing an electro-optical device according to the above-mentioned aspect, preferably, the forming of the second semiconductor layer includes: stacking an amorphous silicon layer on the first semiconductor layer and in the display region; and forming the second semiconductor layer, which is formed of the second single crystal silicon layer, and at least a third semiconductor layer that is provided in the display region and is formed of a polysilicon layer, at the same time by epitaxially growing the amorphous silicon layer.

In the invention, since the third semiconductor layer in the display region can be manufactured by using the polysilicon layer, it is possible to shorten the lifetime of carriers accumulated in the channel region of the third semiconductor layer. As a result, it is possible to reduce or prevent the off-leakage current that is easily generated by optical illumination. Further, since the second semiconductor layer and the third semiconductor layer are formed of the amorphous silicon layer that is manufactured by the same process of the manufacturing process, the second semiconductor layer and the third semiconductor layer can be manufactured as different kinds of semiconductor layers without complicating the manufacturing process. That is, the second semiconductor layer can be formed of the single crystal silicon layer, and the third semiconductor layer can be formed of the polysilicon layer.

Furthermore, according to still another aspect of the invention, a semiconductor device includes: a first semiconductor layer that has an SOI structure and is formed of a first single crystal silicon layer; and a second semiconductor layer that is formed of a second single crystal silicon layer formed on the first semiconductor layer by epitaxial growth.

The semiconductor device described above has a two-layered structure including the first semiconductor layer, which has the SOI structure, and the second semiconductor layer, which is formed by the epitaxial growth. Therefore, it is possible to improve the performance, such as the operation speed, of the driving circuit by adjusting the impurity concentration of each of the first semiconductor layer and the second semiconductor layer.

Such effects and other advantages of the invention will be apparent from the following embodiments to be described.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described with reference to the accompanying drawings. In the embodiments to be described below, a TFT-active-matrix-driving-type liquid crystal device having a built-in driving circuit, which is an example of an electro-optical device of the invention, will be exemplified.

First Embodiment

A liquid crystal device according to a first embodiment of the invention will be described with reference to FIGS. 1 to 7.

First, an overall configuration of the liquid crystal device according to the present embodiment will be described with reference to FIGS. 1 and 2. Here, FIG. 1 is a plan view illustrating the configuration of the liquid crystal device according to the present embodiment, and FIG. 2 is a cross-sectional view taken along the line II-II of FIG. 1.

Figure 1:
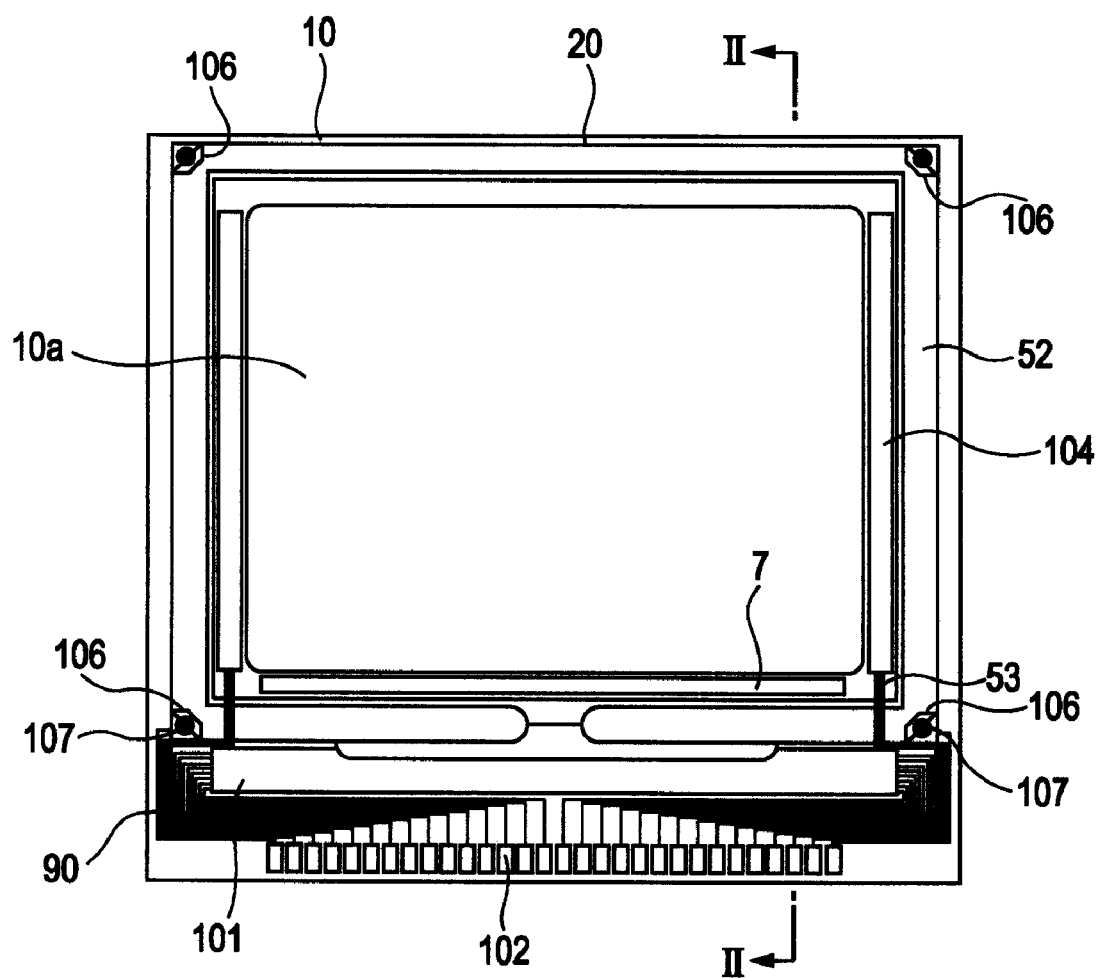
FIG. 1 is a plan view illustrating the overall configuration of a liquid crystal device according to a first embodiment of the invention.
Figure 2:
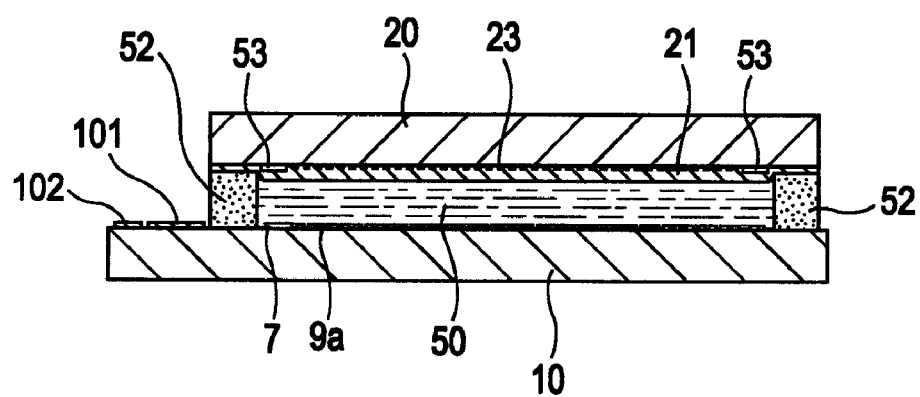
FIG. 2 is a cross-sectional view taken along the line II-II of FIG. 1.

In the liquid crystal device according to the present embodiment shown in FIGS. 1 and 2, a TFT array substrate 10 and a counter substrate 20 are disposed to face each other. A liquid crystal layer 50 is interposed between the TFT array substrate 10 and the counter substrate 20, and the TFT array substrate 10 and the counter substrate 20 are bonded to each other by sealant 52 provided in a sealed region located around an image display region 10a that is an example of a 'display region' according to the present embodiment of the invention.

In FIG. 1, a frame-shaped light-shielding layer 53, which has a light-shielding property and defines a frame region of the image display region 10a, is provided at the counter substrate 20 side so as to be parallel to inner sides of the sealed region where the sealant 52 is disposed. In a peripheral region located outside the sealed region where the sealant 52 is disposed, a data line driving circuit 101, which is an example of a 'driving circuit' according to the invention, and external circuit connection terminals 102 are provided along one side of the TFT array substrate 10. A sampling circuit 7, which is an example of the 'driving circuit' according to the invention, is provided inwardly from the sealed region located along the one side so as to be covered by the frame-shaped light-shielding layer 53. Further, scanning line driving circuits 104, which are examples of the 'driving circuit' according to the invention, are provided inwardly from the sealed region located along two sides adjacent to the one side, so as to be covered by the frame-shaped light-shielding layer 53. In addition, although not shown in FIG. 1, a plurality of wiring lines 105 (refer to FIG. 3) are provided along a remaining one side of the TFT array substrate 10 in order to connect between the two scanning line driving circuits 104 provided at the two sides of the image display region 10a, and the plurality of wiring lines 105 are covered by the frame-shaped light-shielding layer 53. In addition, on the TFT array substrate 10, upper and lower conducting terminals 106, which connect the two substrates 10 and 20 to each other with upper and lower conducting members 107, are provided at regions opposite to four corners of the counter substrate 20. Thus, the electrical conduction between the TFT array substrate 10 and the counter substrate 20 can be made.

On the TFT array substrate 10, wiring lines 90 are formed so as to electrically connect the external circuit connection terminals 102, the data line driving circuit 101, the scanning line driving circuits 104, the upper and lower conducting terminals 106, and the like to one another.

In FIG. 2, in the image display region 10a on the TFT array substrate 10, a stacked structure is formed in which semiconductor elements formed of pixel switching TFTs (thin film transistors) and wiring lines, such as scanning lines and data lines, are formed. Further, in the peripheral region on the TFT array substrate 10, a stacked structure is formed in which semiconductor elements formed of TFTs for driving circuits, which form the data line driving circuit 101, the scanning line driving circuits 104, and the sampling circuit 7, and the wiring lines 90 are formed. In the image display region 10a, pixel electrodes 9a are provided above the pixel switching TFTs and the wiring lines, such as the scanning lines and the data lines. On the other hand, a light shielding layer 23 is provided on the counter substrate 20 facing the TFT array substrate 10. In addition, counter electrodes 21 made of a transparent material, such as ITO, are formed on the light shielding layer 23 so as to face a plurality of pixel electrodes 9a. In addition, the liquid crystal layer 50 is formed of a kind of nematic liquid crystal or formed by mixing several kinds of nematic liquid crystal, for example, and the liquid crystal layer 50 has a predetermined alignment state between a pair of alignment layers.

Further, although not shown in the drawing, in addition to the data line driving circuit 101 and the scanning line driving circuits 104, a test circuit or a test pattern for testing the quality and defects of the liquid crystal device during a manufacturing process or at the time of shipping may be formed on the TFT array substrate 10.

Next, the main configuration of the liquid crystal device according to the present embodiment will be described with reference to FIG. 3. Here, FIG. 3 is a block diagram illustrating the configuration of main parts of the liquid crystal device according to the present embodiment.

Figure 3:
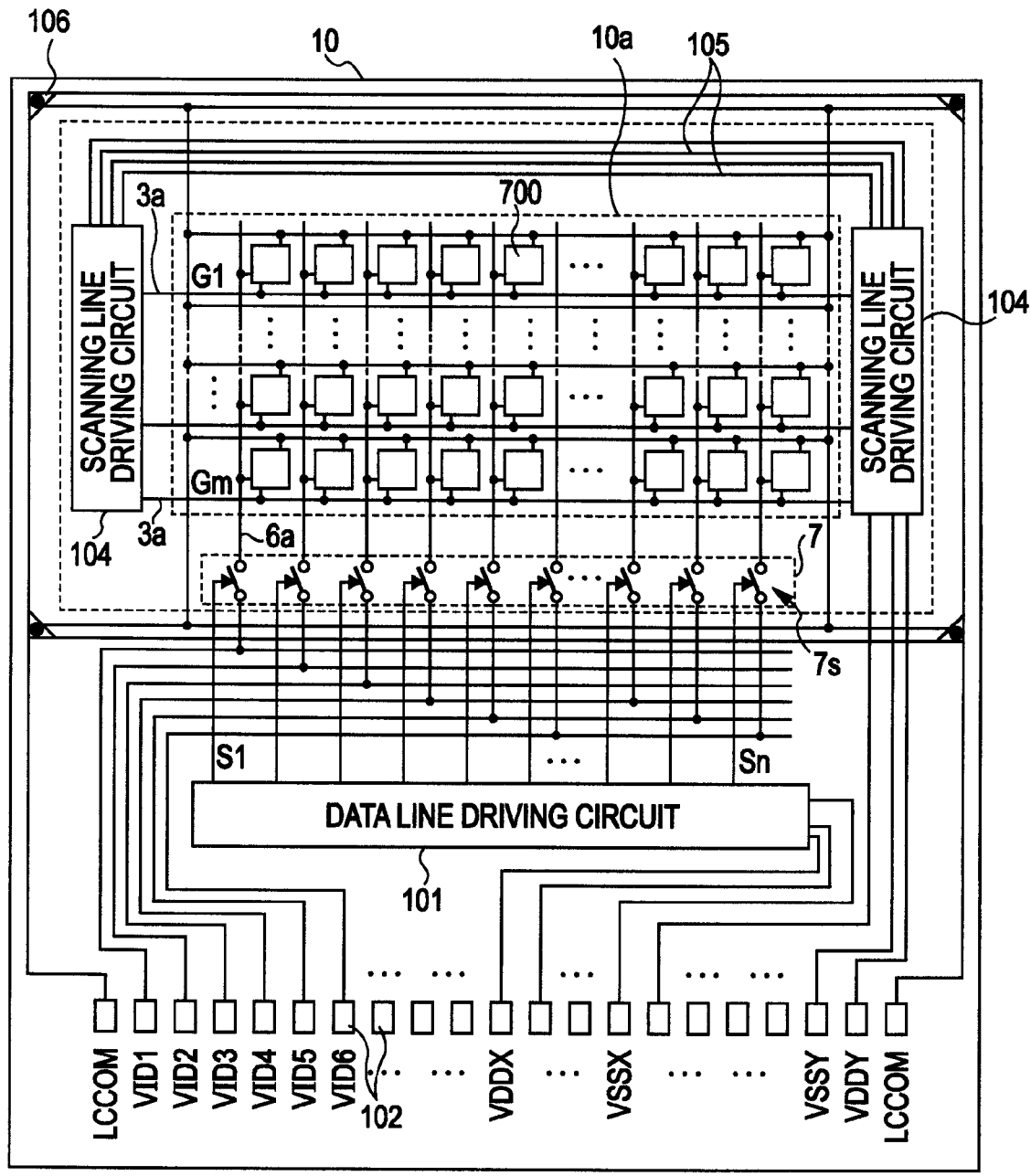
FIG. 3 is a block diagram illustrating the configuration of main parts of the liquid crystal device according to the first embodiment.

Referring to FIG. 3, in the liquid crystal device according to the present embodiment, the driving circuits including the scanning line driving circuits 104, the data line driving circuit 101, and the sampling circuit 7 are formed in the peripheral region, which is located to surround the image display region 10a, on the TFT array substrate 10.

As shown in FIG. 3, various control signals, such as a Y clock signal CLY (and an inverted Y clock signal CLY') and a Y start pulse signal, are supplied from external circuits to the scanning line driving circuits 104 through the external circuit connection terminals 102. The scanning line driving circuits 104 sequentially generate scanning signals G1, . . . , and Gm in this order on the basis of the various signals and then outputs the generated signals to scanning lines 3a. Furthermore, various control signals or power VDDY and VSSY for driving the scanning line driving circuits 104 are supplied to the scanning line driving circuits 104 through the external circuit connection terminals 102.

Further, as shown in FIG. 3, an X clock signal and an X start pulse signal are supplied from external circuits to the data line driving circuit 101 through the external circuit connection terminals 102. When the X start pulse signal is input to the data line driving circuit 101, the data line driving circuit 101 sequentially generates sampling signals S1, . . . , and Sn at timings based on the X clock signal and then outputs the generated sampling signals S1, . . . , and Sn. Furthermore, various control signals or power VDDX and VSSX for driving the data line driving circuit 101 are supplied to the data line driving circuit 101 through the external circuit connection terminals 102.

The sampling circuit 7 has a plurality of sampling switches 7s formed of P-channel or N-channel TFTs or complementary TFTs.

Further, as shown in FIG. 3, in the liquid crystal device according to the present embodiment, a plurality of pixel units 700 arrayed in a matrix are provided in the image display region 10a located at a central portion of the TFT array substrate 10.

Figure 4:
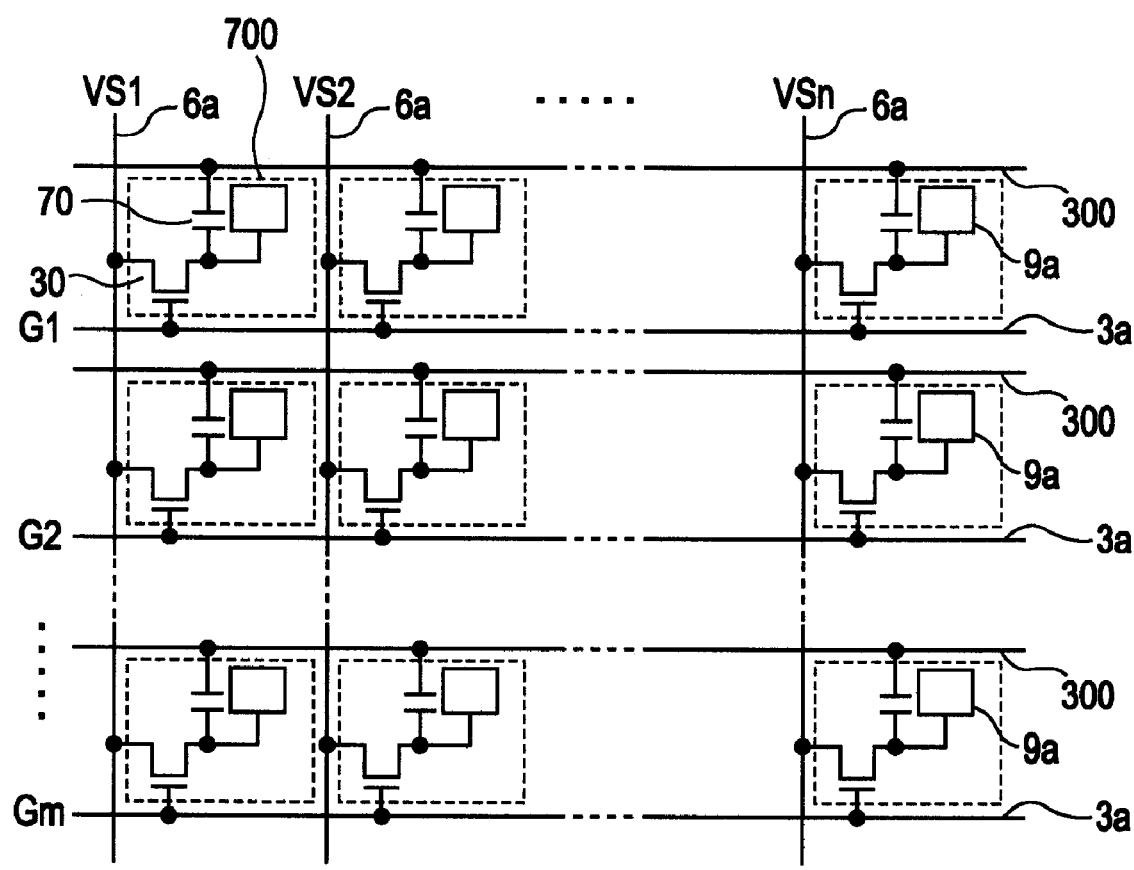
FIG. 4 is an equivalent circuit diagram illustrating various elements, wiring lines, and the like, in a plurality of pixel units, in the liquid crystal device according to the first embodiment.

Here, the configuration of each of the pixel units 700 in the liquid crystal device according to the present embodiment will be described with reference to FIGS. 3 and 4. FIG. 4 is an equivalent circuit diagram illustrating various elements, wiring lines, and the like, in the plurality of pixels 700 according to the present embodiment.

Referring to FIG. 4, each of the plurality of pixel units 700 includes a pixel electrode 9a and a TFT 30 that controls the pixel electrode 9a by a switching operation, and a corresponding data line 6a to which a corresponding one of the image signals VS1, VS2, . . . , and VSn is supplied is electrically connected to a source of the TFT 30. In addition, as will be described later, the TFT 30 has a semiconductor layer formed of a polysilicon layer.

The scanning line 3a is electrically connected to a gate of the TFT 30, and scanning signals G1, G2, . . . , and Gm are applied to the scanning lines 3a in a pulsed manner and line-sequentially in this order at predetermined timings. The pixel electrode 9a is electrically connected to a drain of the TFT 30, and the image signals VS1, VS2, . . . , and VSn supplied from the data lines 6a are written into the corresponding pixel electrodes 9a at predetermined timings by switching on the TFTs 30 serving as switching elements for only a predetermined period of time.

The image signals VS1, VS2, . . . , and VSn, which have predetermined levels and have been written into liquid crystal by the pixel electrodes 9a, are held between the pixel electrodes 9a and counter electrodes 21 formed on the counter substrate 20 for a predetermined period of time. In the liquid crystal, the alignment or order of a molecule group varies according to the voltage level being applied, and thus it is possible to modulate light and to perform gray-scale display. In the case of a normally white mode, the transmittance with respect to the incident light decreases according to the voltage applied in a unit of each pixel, while in the case of a normally black mode, the transmittance with respect to the incident light increases according to the voltage applied in the unit of each pixel. Therefore, as a whole, light having a contrast according to an image signal is emitted from the liquid crystal device.

In order to prevent the held image signals from leaking, a storage capacitor 70 is provided parallel to a liquid crystal capacitor formed between the pixel electrode 9a and the counter electrode 21 (refer to FIGS. 1 and 2). The storage capacitor 70 is provided parallel to the scanning line 3a, includes a fixed-potential-side capacitor electrode, and is connected to a capacitive line 300 having a predetermined potential. The storage capacitor 70 improves the charge hold characteristic in each pixel electrode. In addition, the electric potential of the capacitive line 300 may be constantly fixed to one voltage value or may change among a plurality of voltage values at a predetermined period.

As described above, since the pixel units 700 are arrayed in the image display region 10a in a matrix, the active matrix driving becomes possible.

Referring back to FIG. 3, image signals correspond to image signals VID1 to VID6 that are serial-to-parallel-converted into six phases, and the image signals are supplied to each group having six data lines 6a. Further, the phase expansion number of image signals (that is, the grouping number of serial-to-parallel-converted image signals) is not limited to the six phases. For example, image signals expanded into a plurality of phases, such as nine phases, twelve phases, or twenty-four phases, may be supplied to sets of the data lines 6a. At this time, the number of data lines 6a included in one set corresponds to the number of expanded phases. Alternatively, the image signals may be supplied to the data lines 6a in a line sequential manner without the serial-to-parallel conversion.

Next, a specific configuration of a pixel unit in the liquid crystal device according to the present embodiment will be described with reference to FIGS. 5 and 6. Here, FIG. 5 is a plan view illustrating a plurality of pixel units adjacent to each other in the liquid crystal device according to the present embodiment, and FIG. 6 is a cross-sectional view taken along the line VI-VI of FIG. 5.

Figure 5:
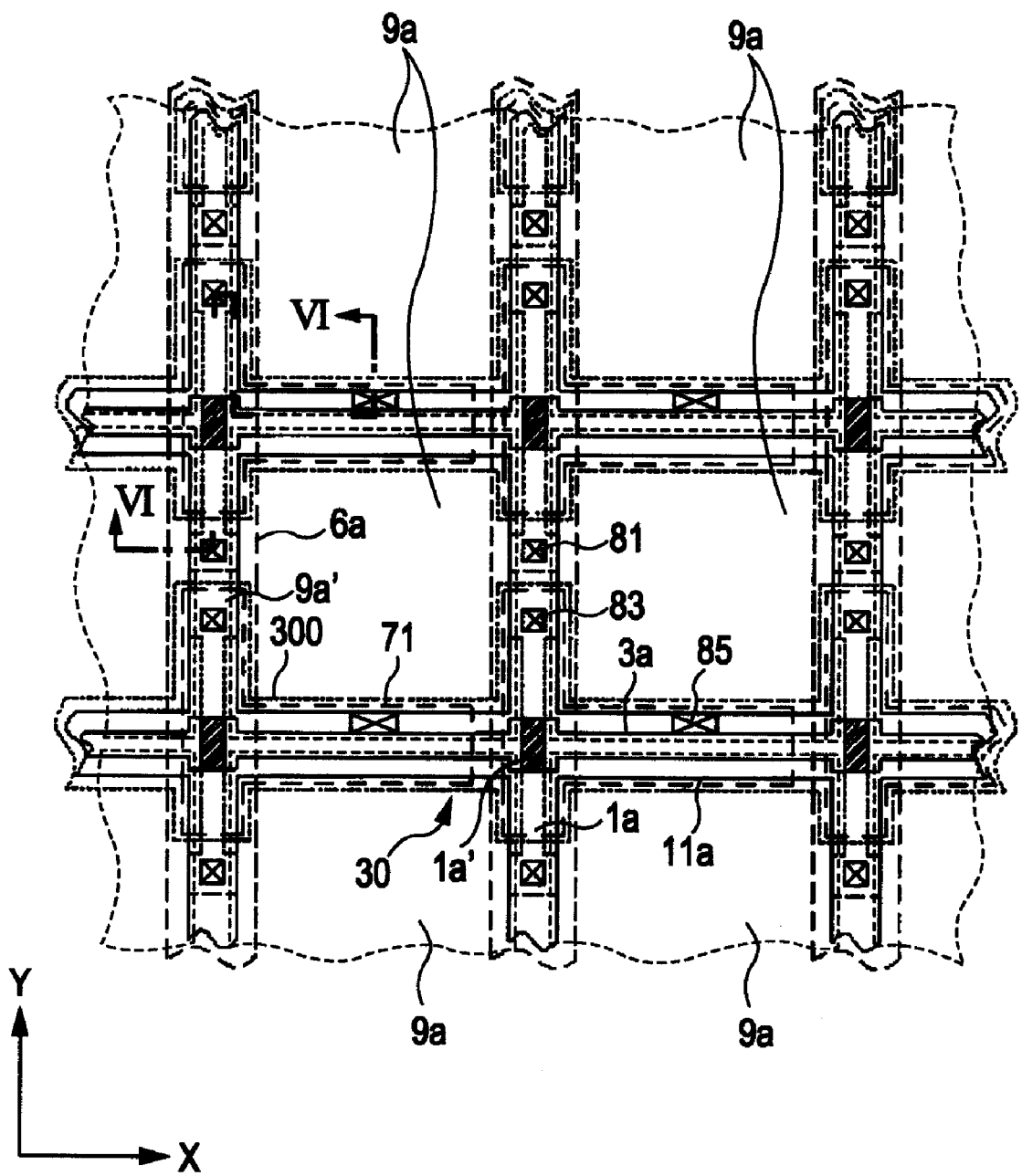
FIG. 5 is a plan view illustrating the plurality of pixel units adjacent to each other in the liquid crystal device according to the first embodiment.

As shown in FIG. 5, the pixel electrodes 9a are provided in a matrix on the TFT array substrate 10 (an outline of each of the pixel electrodes 9a is shown by a dotted line 9a'), and the data lines 6a and the scanning lines 3a are provided along vertical and horizontal boundaries of the pixel electrodes 9a. The data lines 6a is formed of, for example, a metal layer, such as an aluminum layer, or an alloy layer, and the scanning lines 3a is formed of, for example, a conductive polysilicon layer. Furthermore, the scanning line 3a is disposed to be opposite to a channel region 1a, (a region indicated by diagonal lines angled right) of a semiconductor layer 1a, such that the corresponding scanning line 3a serves as a gate electrode. That is, at each of the intersections between the scanning lines 3a and the data lines 6a, the pixel switching TFT 30 in which a main line portion of the scanning line 3a serving as a gate electrode is disposed to be opposite to the channel region 1a' is provided.

Figure 6:
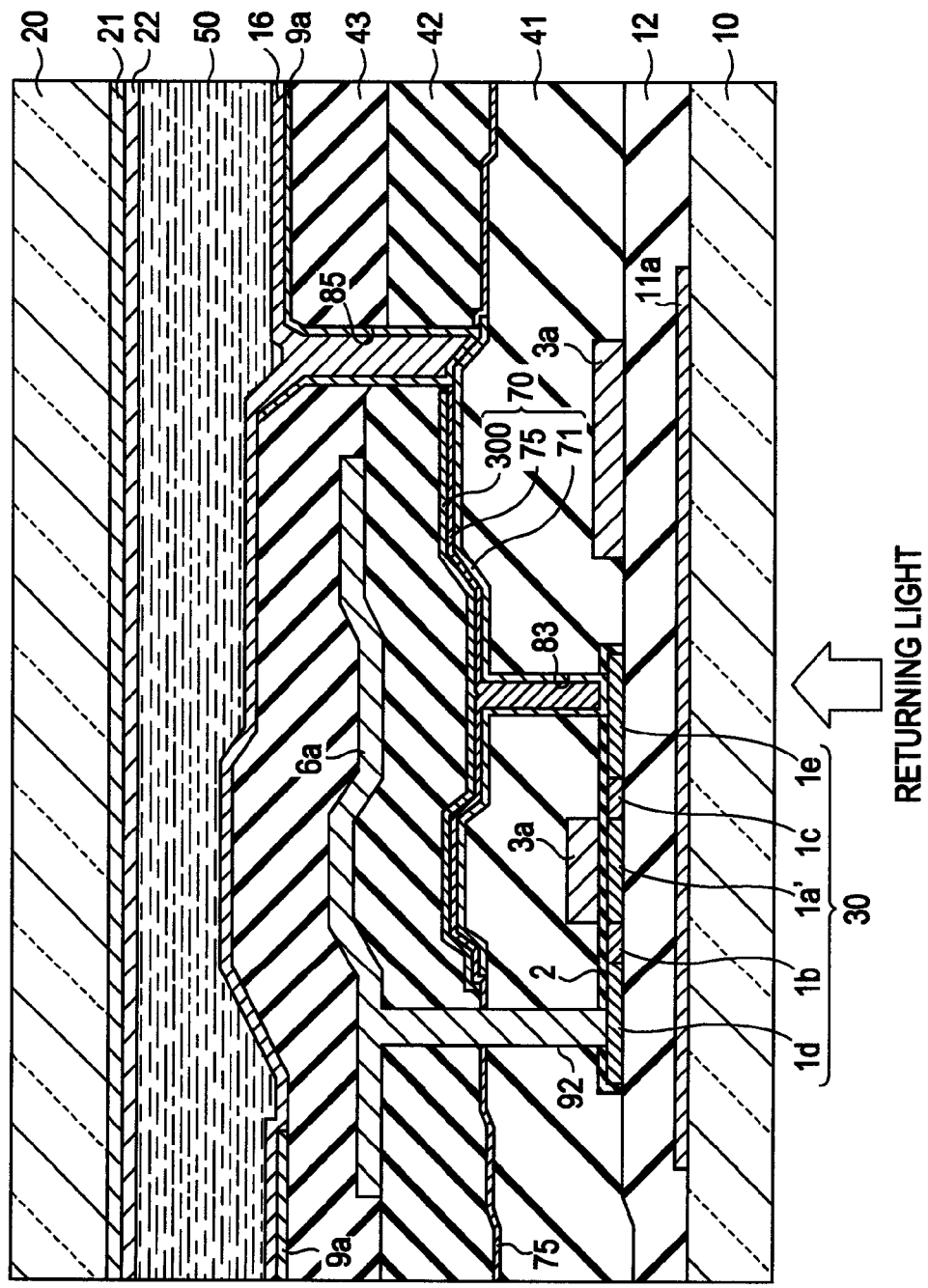
FIG. 6 is a cross-sectional view taken along the line VI-VI of FIG. 5.

As shown in FIG. 6, the liquid crystal device includes the transparent TFT array substrate 10 and the transparent counter substrate 20 opposite to the TFT array substrate 10. The TFT array substrate 10 is formed of, for example, a quartz substrate or a glass substrate, and the counter substrate 20 is formed of, for example, a glass substrate or a quartz substrate. The pixel electrodes 9a are formed on the TFT array substrate 10, and an alignment layer 16 subjected to a predetermined alignment process, such as a rubbing process, is provided on the pixel electrodes 9a. At this time, the pixel electrode 9a is formed of a transparent conductive layer, such as ITO (indium tin oxide). On the other hand, the counter electrodes 21 are formed on the entire surface of the counter substrate 20, and an alignment layer 22 subjected to a predetermined alignment process, such as a rubbing process, is provided on the counter electrodes 21. The counter electrode 21 is formed of a transparent conductive layer such as ITO, in the same manner as the pixel electrode 9a, and each of the alignment layers 16 and 22 is formed of a transparent organic layer, for example, a polyimide layer. The liquid crystal layer 50 has a predetermined alignment state by means of the alignment layers 16 and 22 under a condition in which an electric field from the pixel electrode 9a is not applied thereto.

As shown in FIG. 6, the TFT 30 has an LDD (lightly doped drain) structure. Specifically, the TFT 30 includes: the scanning line 3a serving as a gate electrode; the channel region 1a' of the semiconductor layer 1a which is an example of a 'third semiconductor layer' according to the invention and is formed of a polysilicon layer and in which a channel is formed by an electric field from the scanning line 3a; an insulating layer 2 including a gate insulating layer for insulating the scanning lines 3a from the semiconductor layer 1a; and a lightly-doped source region 1b, a lightly-doped drain region 1c, a heavily-doped source region 1d, and a heavily-doped drain region 1e, which are included in the semiconductor layer 1a.

Further, the TFT 30 preferably has the LDD structure shown in FIG. 6; however, the TFT 30 may have an offset structure in which impurities are not injected into the lightly-doped source region 1b and the lightly-doped drain region 1c or have a self-aligning structure in which the heavily-doped source region 1d and the heavily-doped drain region 1e are formed in a self-aligning manner by injecting heavily-doped impurities with the gate electrode formed of a part of the scanning line 3a as a mask. Further, even though a single gate structure in which only one gate electrode of the TFT 30 is disposed between the heavily-doped source region 1d and the heavily-doped drain region 1e has been used in the present embodiment, two or more gate electrodes may be disposed between the heavily-doped source region 1d and the heavily-doped drain region 1e. By forming a TFT in a dual gate type or a triple or more gate type, it is possible to prevent a leakage current in a junction portion between a channel and source and drain regions and to reduce a current when the TFT is turned off.

In the present embodiment, in particular, the TFT 30 includes the semiconductor layer 1a formed of a polysilicon layer. Therefore, as compared with a case in which the semiconductor layer 1a is formed of, for example, a single crystal silicon layer, it is possible to shorten the lifetime of carriers accumulated in the channel region 1a' of the semiconductor layer 1a. As a result, it is possible to reduce or prevent an off-leakage current that is easily generated by optical illumination and is generated due to long lifetime of carriers.

On the other hand, as shown in FIG. 6, the storage capacitor 70 is formed by disposing a relay layer 71, which serves as a pixel-potential-side capacitor electrode and is connected to the heavily-doped drain region 1e and the pixel electrode 9a, and a part of the capacitive line 300, which serves as a fixed-potential-side capacitor electrode, so as to be opposite to each other through a dielectric layer 75.

The capacitor electrode 300 is made of a metal simplex including at least one high-melting-point metal selected from a group of titanium (Ti), chromium (Cr), tungsten (W), tantalum (Ta), molybdenum (Mo), and the like, an alloy thereof, metal silicide, polysilicide, or a laminate thereof. Further, the capacitor electrode 300 may be formed of an aluminum (Al) layer.

A relay layer 71 is formed of, for example, a conductive polysilicon layer and serves as a pixel-potential-side capacitor electrode. Here, the relay layer 71 may be formed of a single layer or multi layers having metal or alloy, in the same manner as the capacitive line 300 to be described later. Further, the relay layer 71 has a function of relay-connecting the pixel electrode 9a with the heavily-doped drain region 1e of the TFT 30 through contact holes 83 and 85 in addition to a function as the pixel-potential-side capacitor electrode.

The capacitive line 300 serves as a fixed-potential-side capacitor electrode that is disposed opposite to the relay layer 71. As shown in FIG. 5, the capacitive line 300 is formed so as to overlap the scanning line 3a in a region where the scanning line 3a is formed, in plan view. Specifically, the capacitive line 300 has: a main line portion that extends along the scanning line 3a; a protruding portion that protrudes, along the data line 6a, from an intersection between the data line 6a and the scanning line 3a; and a narrow portion that is formed to be slightly narrow in a portion corresponding to the contact hole 85. The protruding portion contributes to an increase in a region where the storage capacitor 70 is to be formed, by using a region on the scanning line 3a and a region below the data line 6a. Preferably, the capacitive line 300 is provided so as to extend from the image display region 10a, in which the pixel electrodes 9a are disposed, to a region surrounding the image display region 10a, and the capacitive line 300 is electrically connected to a constant electric potential source such that the capacitive line 300 has a fixed electric potential. As the constant electric potential source, for example, the power VDDX or VSSX described above, which is supplied to the data line driving circuit 101, may be used, or an opposite electrode potential LCCOM supplied to the counter electrode 21 of the counter substrate 20 may be used.

As shown in FIG. 6, the dielectric layer 75 is formed by using a silicon nitride layer or a silicon oxide layer, such as an HTO (high temperature oxide) layer or an LTO (low temperature oxide) layer, having a relatively small thickness of 5 to 200 nm. From the view point of an increase in the capacitance of the storage capacitor 70, the thinner the dielectric layer 75, the better, as long as the reliability of a layer can sufficiently be obtained.

Further, referring to FIGS. 5 and 6, a lower light-shielding layer 11a is formed below the TFT 30. The lower light-shielding layer 11a is patterned in a matrix, thereby defining opening regions of pixels. The lower light-shielding layer 11a is formed of a single layer or multi layers having metal or alloy, in the same manner as the capacitive line 300 described above. Further, the opening regions are also defined by the data lines 6a shown in FIG. 5 and the capacitive lines 300 formed to cross the data lines 6a. Furthermore, even in the case of the lower light-shielding layer 11a, in order to prevent the voltage variation of the lower light-shielding layer 11a from having an adverse effect on the TFT 30, it is preferable that the lower light-shielding layer 11a be provided so as to extend from the image display region 10a to a region surrounding the image display region 10a and be electrically connected to the constant electric potential source, in the same manner as the capacitive lines 300.

Furthermore, a base insulating layer 12 is formed below the TFT 30. The base insulating layer 12 serves to insulate the TFT 30 from the lower light-shielding layer 11a. In addition, since the base insulating layer 12 is formed on the entire surface of the TFT array substrate 10, the base insulating layer 12 serves to prevent the characteristics of the pixel switching TFT 30 from changing due to roughness after abrading a surface of the TFT array substrate 10 or contamination remaining after a washing process.

In addition, a first interlayer insulating layer 41 is formed on the scanning lines 3a. In the first interlayer insulating layer 41, a contact hole 81 passing through the heavily-doped source region 1d and a contact hole 83 passing through the heavily-doped drain region 1e are formed.

The relay layer 71 and the capacitive line 300 are formed on the first interlayer insulating layer 41, and a second interlayer insulating layer 42 is formed thereon. In the second interlayer insulating layer 42, the contact hole 81 passing through the heavily-doped source region 1d and a contact hole 85 passing through the relay layer 71 are formed.

Furthermore, the data lines 6a are formed on the second interlayer insulating layer 42, and a third interlayer insulating layer 43 is formed thereon. In the third interlayer insulating layer 43, the contact hole 85 passing through the relay layer 71 is formed.

Next, a TFT for driving a circuit (hereinafter, referred to as a 'driving TFT') in the liquid crystal device according to the present embodiment will be described with reference to FIG. 7. Here, FIG. 7 is a cross-sectional view illustrating a driving TFT in the liquid crystal device according to the present embodiment, which is compared with the pixel switching TFT shown in FIG. 6.

As described above with reference to FIG. 3, driving circuits, such as the data line driving circuit 101, the scanning line driving circuits 104, and the sampling circuit 7, are formed on the peripheral region surrounding the image display region 10a on the TFT array substrate 10. Each of these driving circuits includes semiconductor elements, such as switching elements, formed of driving TFTs.

Figure 7:
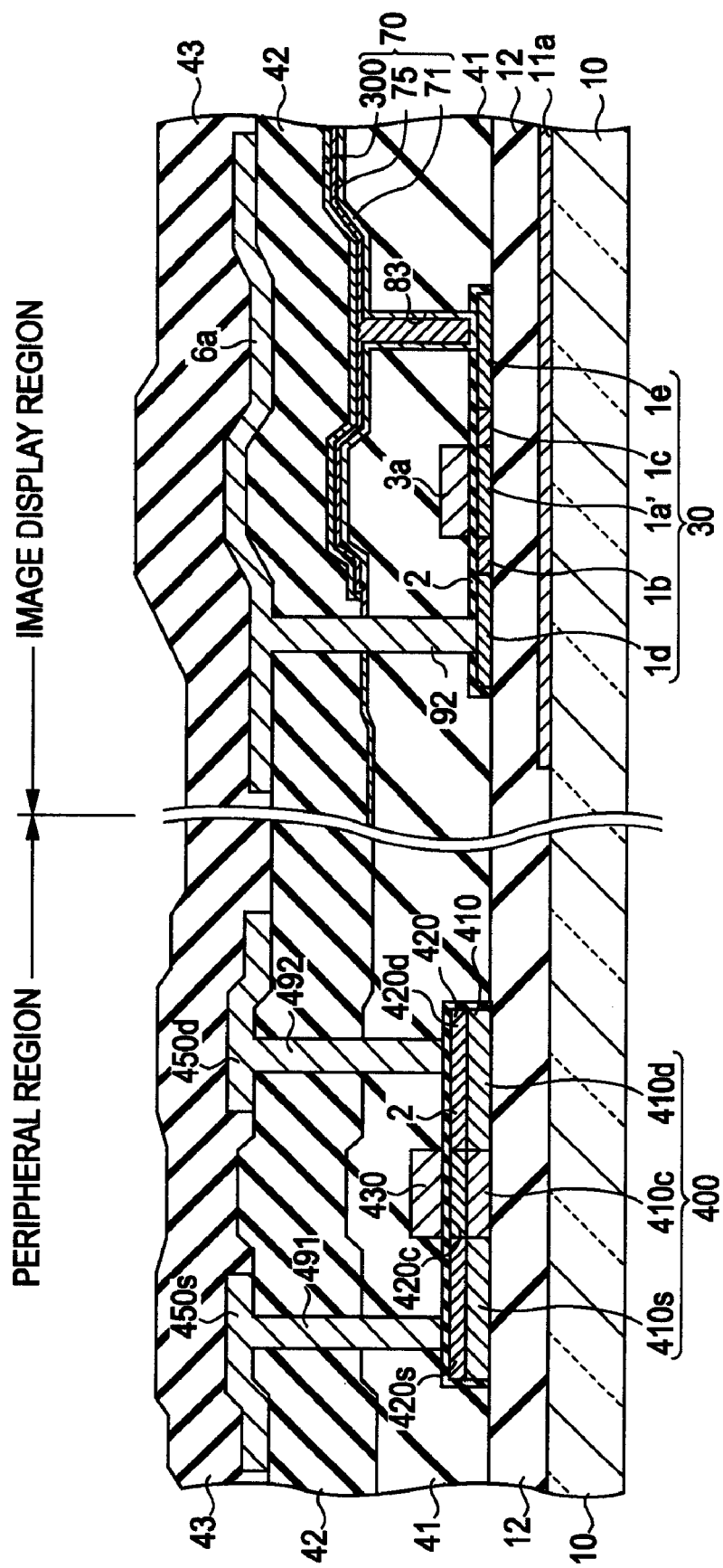
FIG. 7 is a cross-sectional view illustrating a driving TFT in the liquid crystal device according to the first embodiment, which is compared with a pixel switching TFT shown in FIG. 6.

As shown in FIG. 7, in the peripheral region, a driving TFT 400 is formed on the base insulating layer 12.

In the liquid crystal device according to the present embodiment, a semiconductor layer of the driving TFT 400 has a two-layered structure including a first semiconductor layer 410 and a second semiconductor layer 420. Specifically, the TFT 400 includes a gate electrode 430, a channel region 410c of the first semiconductor layer 410, a channel region 420c of the second semiconductor layer 420, an insulating layer having a gate insulating layer for insulating the gate electrode 430 from the first and second semiconductor layers 410 and 420, a source region 410s and a drain region 410d provided in the first semiconductor layer 410, and a source region 420s and a drain region 420d provided in the second semiconductor layer 420. Further, the TFT 4 may have an LDD structure.

The gate electrode 430 is formed by using the same layer (that is, a polysilicon layer) as the scanning line 3a serving as a gate electrode in the pixel switching TFT 30.

The first semiconductor layer 410 has an SOI (silicon on insulator) structure in which a single crystal silicon layer is bonded to the base insulating layer 12 with, for example, a bonding insulating layer interposed therebetween. Further, any kind of methods can be used to form single crystallization of silicon. The first semiconductor layer 410 has a structure in which the source region 410s and the drain region 410d are disposed at both sides thereof with the channel region 410c interposed therebetween.

The second semiconductor layer 420 is formed of an epitaxial layer (that is, a single crystal silicon layer) obtained by epitaxially growing, for example, amorphous silicon on the first semiconductor layer 410 formed of a single crystal silicon layer. Second semiconductor layer 420 has a structure in which the source region 420s and the drain region 420d are disposed at both sides with the channel region 420c interposed therebetween.

In addition, the first and second interlayer insulating layers 41 and 42 are disposed so as to cover the gate electrode 430, and a source electrode 450s and a drain electrode 450d are disposed on the first interlayer insulating layer 41.

The source electrode 450s is electrically connected to the source region 420s through a contact hole 491 passing through the first and second interlayer insulating layers 41 and 42 and the insulating layer 2.

The drain electrode 450d is electrically connected to the drain region 420d through a contact hole 492 passing through the first and second interlayer insulating layers 41 and 42 and the insulating layer 2.

The third interlayer insulating layer 43 is stacked on the second interlayer insulating layer 42 on which the source electrode 450s and the drain electrode 450d are formed.

As described above, the driving TFT 400 has the two-layered structure including the first semiconductor layer 410 and the second semiconductor layer 420. Accordingly, for example, by making the impurity concentration (that is, carrier concentration) of the second semiconductor layer 420 lower than that of the first semiconductor layer 410 (for example, the specific resistance of the second semiconductor layer 420 is set to be larger than 22 Ωm and the specific resistance of the first semiconductor layer 410 is set to be within a range of 14 to 22 Ωm), it is possible to make the layer thickness of the first semiconductor layer 410 smaller than that of the second semiconductor layer 420. As a result, it is possible to realize a partial-depletion-mode semiconductor element and to reduce the scattering of carriers in the second semiconductor layer 420. In other words, it is possible to increase the operation speed of a driving circuit by adjusting the impurity concentration of each of the first semiconductor layer 410 and the second semiconductor layer 420.

Figure 8:
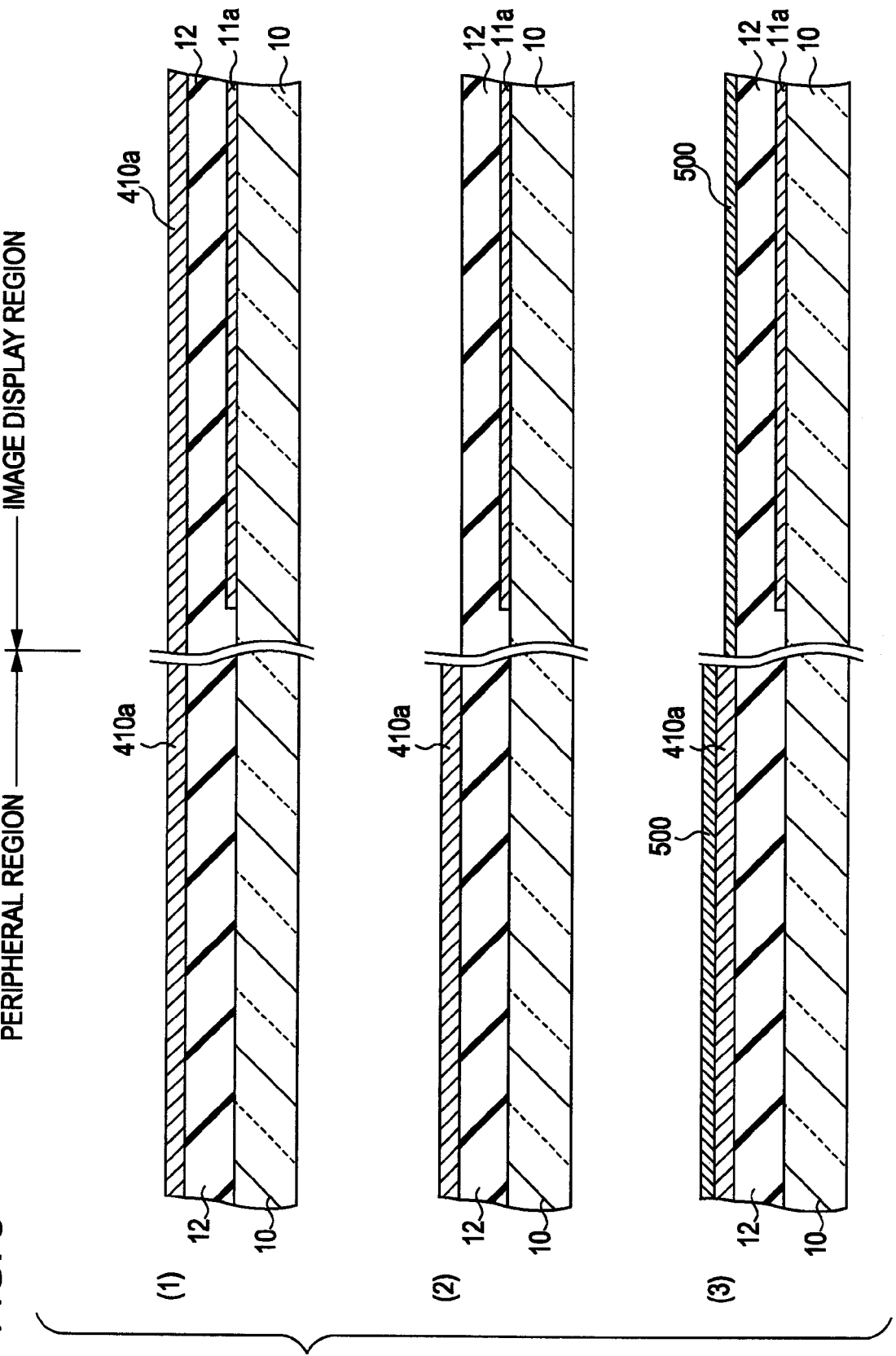
FIG. 8 is a cross-sectional view illustrating a series of processes of manufacturing the liquid crystal device according to the first embodiment, which shows processes (1) to (3).
Figure 9:
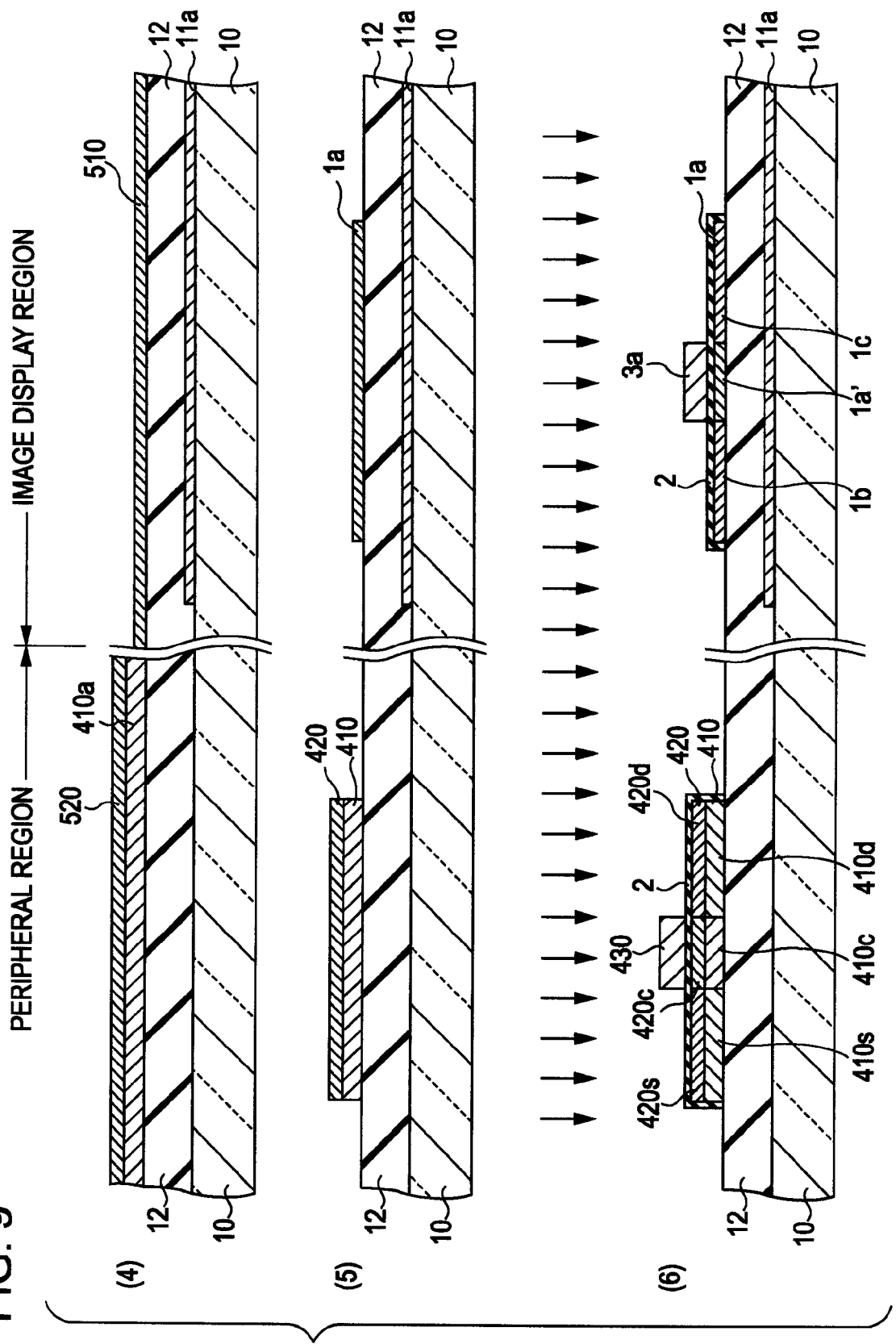
FIG. 9 is a cross-sectional view illustrating a series of processes of manufacturing the liquid crystal device according to the first embodiment, which shows processes (4) to (6).
Figure 10:
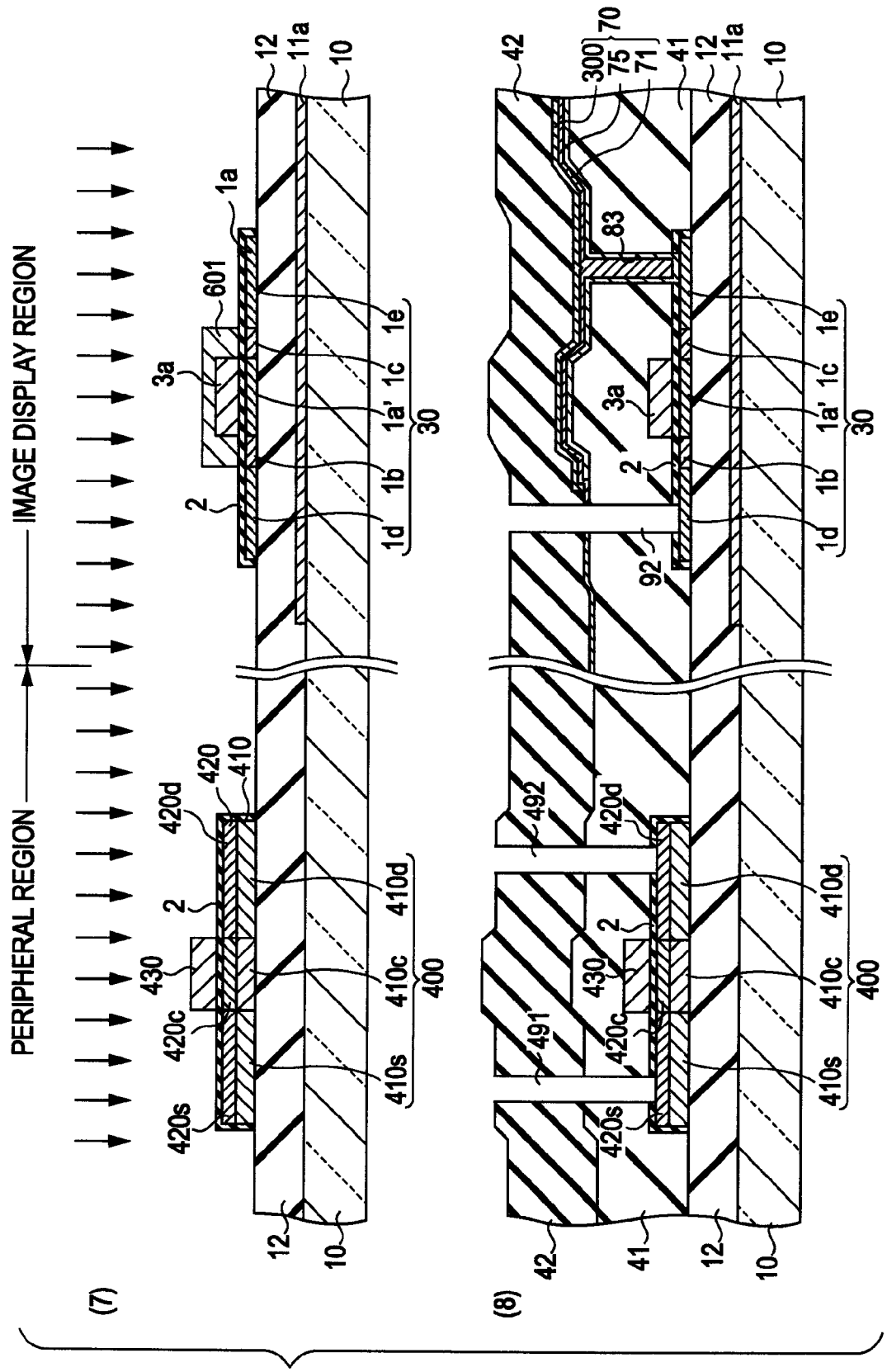
FIG. 10 is a cross-sectional view illustrating a series of processes of manufacturing the liquid crystal device according to the first embodiment, which shows processes (7) and (8).

Next, a method of manufacturing the liquid crystal device according to the present embodiment will be described with reference to FIGS. 8 to 10. Here, FIGS. 8 to 10 are cross-sectional views illustrating a series of processes of manufacturing the liquid crystal device according to the present embodiment. In addition, in FIGS. 8 to 10, each drawing corresponds to the cross-sectional view illustrating the pixel switching TFT and the driving TFT shown in FIG. 7.

First, referring to a process (1) shown in FIG. 8, the TFT array substrate 10 formed of, for example, a quartz substrate or a glass substrate, is prepared. Here, the TFT array substrate 10 is subjected to an annealing process, preferably, in an inert gas atmosphere, such as N2 (nitrogen), and at a temperature of about 850 to 1300° C., more preferably, at a high temperature of 1000° C., such that distortion occurring in the TFT array substrate 10 can be reduced during a subsequent high-temperature process. In other words, preferably, the TFT array substrate 10 is subjected to heat treatment at the same temperature as the highest temperature during the manufacturing process or at a temperature higher than the highest temperature.

Thereafter, in the image display region 10a, a light-shielding layer, which is formed of a metal, such as Ti, Cr, W, Ta, Mo, and Pb, or a metal alloy layer, such as metal silicide, is formed on the TFT array substrate 10 so as to have a layer thickness of about 100 to 500 nm, in this embodiment, a layer thickness of about 200 nm by a sputtering process, and then the light-shielding layer is etched to be patterned, thereby forming the light-shielding layer 11a.

Then, the base insulating layer 12 formed of a silicon nitride layer, a silicon oxide layer, or a silicate glass layer, which is made of, for example, NSG (non-silicate glass), PSG (phosphosilicate glass), BSG (borosilicate glass), or BPSG (borophosphosilicate glass), is formed on the entire surface (that is, the image display region 10a and the peripheral region) of the TFT array substrate 10 by using an atmospheric pressure CVD (chemical vapor deposition) method or a low pressure CVD method using TEOS (tetra•ethyl•ortho•silicate) gas, TEB (tetra•ethyl•borate) gas, or TMOP (tetra•ethyl•oxy•phosphate) gas, for example. The layer thickness of the base insulating layer 12 is set to be within a range of 400 to 1200 nm, for example. In the present embodiment, the layer thickness of the base insulating layer 12 is set to 1100 nm. Then, the entire surface of the base insulating layer 12 is polished so as to be planarized. As a planarization method using the polishing operation, a CMP method can be used, for example. Here, the layer thickness of the base insulating layer 12 having been subjected to the planarization process is set to be about 600 nm.

Subsequently, the base insulating layer 12 formed on the entire surface of the TFT array substrate 10 is bonded to a single crystal silicon layer 410a. The base insulating layer 12 and the single crystal silicon layer 410a can be directly bonded to each other by means of two-hour heat treatment at the temperature of 300° C., for example. As a bonding method, a unibonding method may be used, for example. In the unibonding method, a single crystal silicon layer is formed on a substrate by using, for example, a smart cutting method in which a single crystal silicon substrate, into which hydrogen ions are injected, is bonded to the substrate and is then separated therefrom by means of heat treatment. In this case, it is possible to obtain a single crystal silicon layer having a considerably uniform layer thickness over the entire surface of the substrate. Further, the single crystal silicon layer may be formed by forming a single crystal silicon substrate, into which hydrogen ions are not injected, on a substrate, bonding the single crystal silicon substrate and the substrate to each other by heat treatment, and then etching the single crystal silicon substrate by means of a PACE (plasma assisted chemical etching) method. By using the PACE method, it is possible to obtain the single crystal silicon layer having layer thickness uniformity within 10%, with respect to the layer thickness of 100 nm, for example.

Then, referring to a process (2) shown in FIG. 8, the single crystal silicon layer 410a is patterned by using, for example, a photolithographic process and an etching process, such that the single crystal silicon layer 410a located in the image display region 10a is removed and the single crystal silicon layer 410a located in the peripheral region including a region where the driving TFTs are to be formed remains.

Then, referring to a process (3) shown in FIG. 8, amorphous silicon is deposited on the entire surface of the TFT array substrate 10 so as to form an amorphous silicon layer 500. That is, in the image display region 10a, the amorphous silicon layer 500 is formed on the base insulating layer 12, and in the peripheral region, the amorphous silicon layer 500 is formed on the single crystal silicon layer 410a.

Then, referring to a process (4) shown in FIG. 9, in a nitrogen atmosphere, six-hour heat treatment is performed at the temperature of 600 to 700° C., in the present embodiment, 640° C., and then solid-state growth is performed. By this process, the amorphous silicon layer 500 in the image display region 10a is converted to polysilicon, and thus a polysilicon layer 510 is formed. On the other hand, since the amorphous silicon layer 500 in the peripheral region is formed on the single crystal silicon layer 410a, the amorphous silicon layer 500 in the peripheral region is epitaxially grown, and thus an epitaxial layer 520 (that is, a single crystal silicon layer) is formed. Here, as a method in which the amorphous silicon layer 500 is converted to polysilicon or a method of the solid-state growth, laser annealing may be used.

Thereafter, referring to a process (5) shown in FIG. 9, in the image display region 10a, the semiconductor layer 1a is formed by patterning the polysilicon layer 510 by means of a photolithographic process and an etching process, for example. On the other hand, in the peripheral region, the first semiconductor layer 410 and the second semiconductor layer 420 are formed by patterning the single crystal silicon layer 410a and the epitaxial layer 520 by means of the photolithographic process and the etching process, for example.

Then, referring to a process (6) shown in FIG. 9, a high-temperature silicon oxide (HTO) layer is formed on the semiconductor layer 1a in the image display region 10a and the first semiconductor layer 410 and the second semiconductor layer 420 in the peripheral region by using a low pressure CVD method, for example. Thus, the insulating layer 2, which serves as a gate insulating layer having a two-layered structure of the thermally-oxidized silicon layer and the HTO layer. Here, the thickness of the insulating layer 2 is set to be within a range of 60 to 80 nm, for example.

Then, the scanning line 3a serving as the gate electrode is formed in the image display region 10a. On the other hand, the gate electrode 430 is formed in the peripheral region. Then, impurities, which are V-group elements such as P, are doped into the semiconductor layer 1a, the first semiconductor layer 410, and the second semiconductor layer 420. At this time, the scanning line 3a serves as a mask in the semiconductor layer 1a, and the gate electrode 430 serves as a mask in the first semiconductor layer 410 and the second semiconductor layer 420. Thus, the channel region 1a, of the semiconductor layer 1a, the lightly-doped source region 1b, and the lightly-doped drain region 1c are formed in the image display region 10a. On the other hand, the channel region 410c, the source region 410s, and the drain region 410d of the first semiconductor layer 410 and the channel region 420c, the source region 420s, and the drain region 420d of the second semiconductor layer 420 are formed in the peripheral region.

subsequently, referring to a process (7) shown in FIG. 10, a resist layer 601 having a width larger than the scanning line 3a serving as a gate electrode is formed in the image display region 10a. Then, impurities, which are V-group elements such as P, are doped into the semiconductor layer 1a, the first semiconductor layer 410, and the second semiconductor layer 420. At this time, the resist layer 601 serves as a mask in the semiconductor layer 1a, and the gate electrode 430 serves as a mask in the first semiconductor layer 410 and the second semiconductor layer 420. Thus, the heavily-doped source region 1d and the heavily-doped drain region 1e of the semiconductor layer 1a are formed in the image display region 10a. On the other hand, in the peripheral region, the resistances of the source region 410s and the drain region 410d of the first semiconductor layer 410 and the resistances of the source region 420s and the drain region 420d of the second semiconductor layer 420 become low. After doping the impurities, the resist layer 601 is removed. Thus, the pixel switching TFT 30 is formed in the image display region 10a, and the driving TFT 400 is formed in the peripheral region.

Then, referring to a process (8) shown in FIG. 10, the first interlayer insulating layer 41 formed of a silicon nitride layer, a silicon oxide layer, or a silicate glass layer, which is made of, for example, NSG, PSG, BSG, or BPSG, is formed on the entire surface of the TFT array substrate 10, that is, so as to cover the pixel switching TFT 30 or the driving TFT 400, by using the atmospheric pressure CVD method or the low pressure CVD method using TEOS gas, for example. The layer thickness of the first interlayer insulating layer 41 is preferably within a range of 500 to 1500 nm, and more preferably, 800 nm.

Then, in the image display region 10a, the contact hole 83 for electrically connecting the relay layer 71 serving as a pixel-potential-side capacitor electrode of the storage capacitor 70 with the heavily-doped drain region 1e of the TFT 30 is provided in the first interlayer insulating layer 41 by performing a dry etching process, such as a reactive etching process or a reactive ion beam etching process, or a wet etching process. Then, the relay layer 71, the dielectric layer 75, and the capacitive line 300 are stacked in this order, thereby forming the storage capacitor 70. At this time, the relay layer 71 is formed by stacking, for example, a conductive polysilicon layer. The dielectric layer 75 is formed by stacking, for example, a silicon nitride layer or a silicon oxide layer, such as an HTO (high temperature oxide) layer or an LTO (low temperature oxide) layer, having a relatively small thickness of 5 to 200 nm. The capacitive line 300 is formed of a metal simplex including at least one high-melting-point metal selected from a group of Ti, Cr, W, Ta, Mo, and the like, an alloy thereof, metal silicide, polysilicide, a laminate thereof, or an Al layer.

Thereafter, the second interlayer insulating layer 42 formed of a silicon nitride layer, a silicon oxide layer, or a silicate glass layer, which is made of, for example, NSG, PSG, BSG, or BPSG, is formed on the entire surface of the TFT array substrate 10, that is, on the first interlayer insulating layer 41 including the storage capacitor 70, by means of an atmospheric pressure CVD method or a low pressure CVD method using TEOS gas, for example. The layer thickness of the second interlayer insulating layer 42 is preferably within a range of 500 to 1500 nm, and more preferably, 800 nm.

Then, in the image display region 10a, the contact hole 92 for electrically connecting the data line 6a (refer to FIG. 7) with the heavily-doped source region 1d of the TFT 30 is provided so as to pass through the first interlayer insulating layer 41 and the second interlayer insulating layer 42 by performing a dry etching process, such as a reactive etching process or a reactive ion beam etching process, or a wet etching process. On the other hand, in the peripheral region, the contact hole 491 for electrically connecting the source electrode 450s (refer to FIG. 7) with the source region 420s of the TFT 400 is provided so as to pass through the first interlayer insulating layer 41 and the second interlayer insulating layer 42 and the contact hole 492 for electrically connecting the drain electrode 450d (refer to FIG. 7) with the drain region 420d of the TFT 400 is provided so as to pass through the first interlayer insulating layer 41 and the second interlayer insulating layer 42, in the same manner as the contact hole 92.

Thereafter, a metal layer made of low-resistance metal, such as Al, or metal silicide is deposited on the second interlayer insulating layer 42 so as to have a thickness of about 100 to 700 nm, preferably, about 350 nm by means of a sputtering process. Then, the metal layer is patterned by using, for example, a photolithographic process and an etching process, thereby forming the data line 6a, the source electrode 450s, and the drain electrode 450d (refer to FIG. 7).

Then, the third interlayer insulating layer 43 (refer to FIG. 7) formed of a silicon nitride layer, a silicon oxide layer, or a silicate glass layer, which is made of, for example, NSG, PSG, BSG, or BPSG, is formed on the entire surface of the TFT array substrate 10, that is, on the second interlayer insulating layer 42 including the data line 6a, the source electrode 450s, and the drain electrode 450d, by means of an atmospheric pressure CVD method or a low pressure CVD method using TEOS gas, for example. The layer thickness of the third interlayer insulating layer 43 is preferably within a range of 500 to 1500 nm, and more preferably, 800 nm.

Subsequently, in the image display region 10a, the contact hole 85 (refer to FIG. 6) for electrically connecting the pixel electrode 9a with the relay layer 71 is provided so as to pass through the second interlayer insulating layer 42 and the third interlayer insulating layer 43 by performing a dry etching process, such as a reactive etching process or a reactive ion beam etching process, or a wet etching process.

Then, in the image display region 10a, a transparent conductive thin layer, such as an ITO layer, is deposited on the third interlayer insulating layer 43 so as to have a thickness of about 50 to 200 nm by means of a sputtering process and is then etched, thereby forming the pixel electrode 9a (refer to FIG. 6).

Then, a polyimide-based coating material for an alignment layer is coated on the pixel electrode 9a and then a rubbing process is performed in a predetermined direction so that the coating material can have a predetermined pre-tilt angle, thereby forming the alignment layer 16 (refer to FIG. 6).

On the other hand, for the counter substrate 20 shown in FIG. 6, for example, a glass substrate is prepared as the counter substrate 20. Then, for example, metal chrome is sputtered onto the counter substrate 20 and then a photolithographic process and an etching process are performed, thereby forming the light-shielding layer 23 (refer to FIG. 2) having the matrix shape. Further, the light-shielding layer 23 is made of a metal material, such as Cr, Ni, or Al, or resin black in which carbon or Ti is dispersed in photoresist.

Then, a transparent conductive thin layer, such as an ITO layer, is deposited on the entire surface of the counter substrate 20 so as to have a thickness of about 50 to 200 nm by means of a sputtering process, thereby forming the counter electrode 21. Further, after the polyimide-based coating material for an alignment layer is coated on the entire surface of the counter electrode 21, a rubbing process is performed in a predetermined direction so that the coating material can have a predetermined pre-tilt angle, thereby forming the alignment layer 22.

Finally, the TFT array substrate 10 and the counter substrate 20, in which the respective layers are formed as described above, are bonded to each other by sealant (refer to FIGS. 1 and 2) such that the alignment layers 16 and 22 are opposite to each other, and then liquid crystal, which is obtained by mixing, for example, a plurality of kinds of nematic liquid crystal, is sucked into a space between the TFT array substrate 10 and the counter substrate 20. Thus, the liquid crystal layer 50 having a predetermined thickness is formed.

According to the above-described method of manufacturing the liquid crystal device, the driving TFT 400 can have a two-layered structure including the first semiconductor layer 410, which has the SOI structure, and the second semiconductor layer 420, which is formed by the epitaxial growth. As a result, it is possible to improve the performance, such as an operation speed, of a driving circuit by adjusting the impurity concentration of each of the first semiconductor layer 410 and the second semiconductor layer 420.

Further, according to the above-described method of manufacturing the liquid crystal device, since the semiconductor layer 1a in the image display region 10a can be manufactured by using a polysilicon layer, it is possible to shorten the lifetime of carriers accumulated in the channel region 1a' of the semiconductor layer 1a. As a result, it is possible to reduce or prevent an off-leakage current that is easily generated by optical illumination. Further, since the semiconductor layer 420 forming the TFT 400 and the semiconductor layer 1a forming the TFT 30 are formed of the amorphous silicon layer 500 that is manufactured by the same process (refer to the process (3) shown in FIG. 8 and the process (4) shown in FIG. 9) of the manufacturing process, the second semiconductor layer 420 and the semiconductor layer 1a can be manufactured as different kinds of semiconductor layers without complicating the manufacturing process. That is, the second semiconductor layer 420 can be formed of the epitaxial layer 520 (that is, a single crystal silicon layer), and the semiconductor layer 1a can be formed of the polysilicon layer 510.

Electronic Apparatus

Next, cases in which the liquid crystal device, which is the above-described electro-optical device, is applied to various electronic apparatuses will be described.

Figure 11:
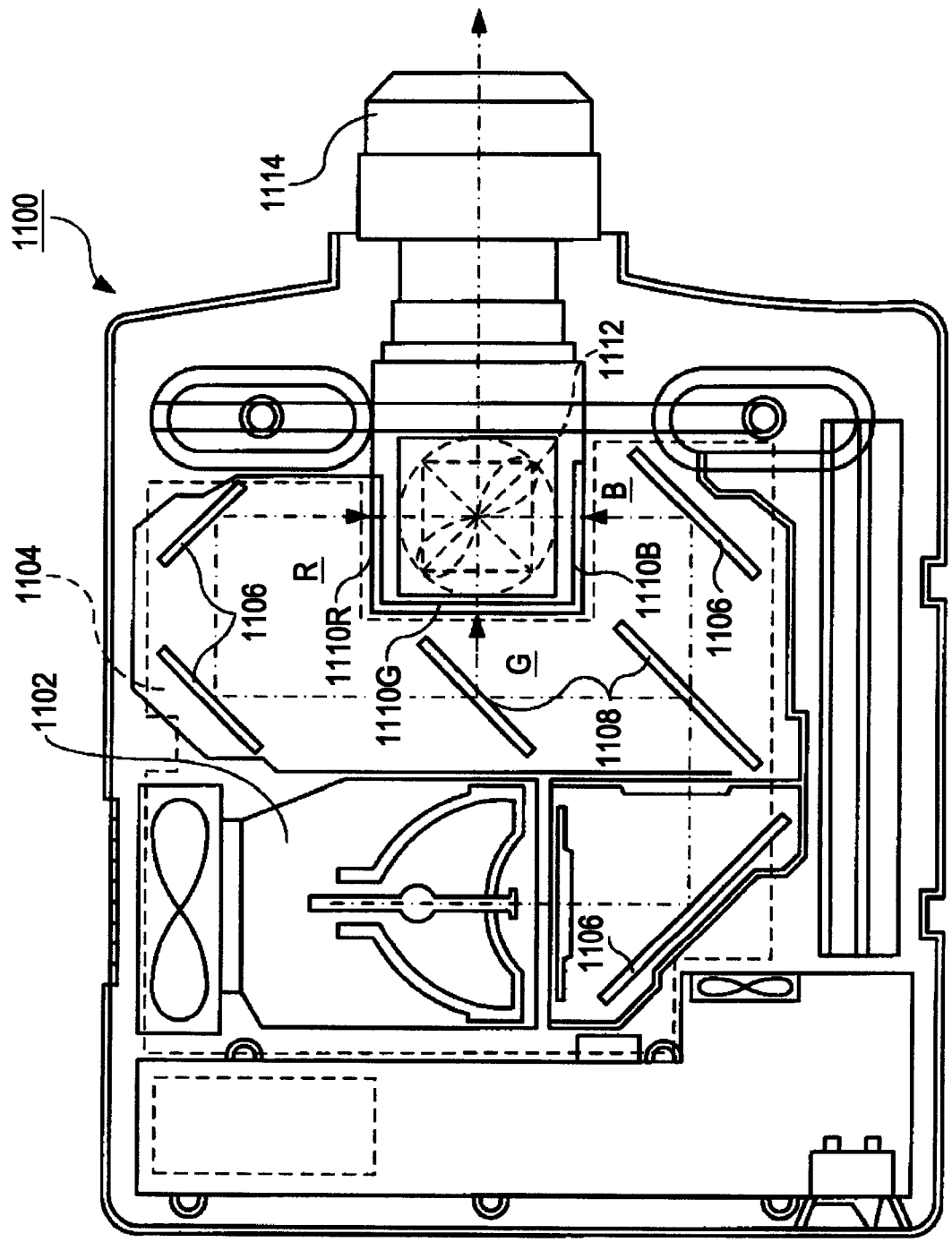
FIG. 11 is a plan view illustrating the configuration of a projector, which is an example of an electronic apparatus, to which an electro-optical device is applied.

First, a projector that uses the liquid crystal device as a light valve will be described. FIG. 11 is a plan view illustrating an example of the configuration of a projector. As shown in FIG. 11, a projector 1100 includes a lamp unit 1102 formed of a white light source, such as a halogen lamp. Projection light emitted from the lamp unit 1102 is separated into light components having three primary colors of R (red), G (green), and B (blue) by four mirrors 1106 and two dichroic mirrors 1108 provided within a light guide 1104, and the light components having the three primary colors are respectively incident on liquid crystal panels 1110R, 1110B, and 1110G, serving as light valves, corresponding to the respective primary colors.

The configurations of the liquid crystal panels 1110R, 1110G, and 1110B are the same as that of the above-described liquid crystal device, and the liquid crystal panels 1110R, 1110B, and 1110G are respectively driven by R, G, and B primary color signals supplied from an image signal processing circuit. The light components modulated by the liquid crystal panels 1110R, 1110B, and 1110G are incident on a dichroic prism 1112 from three directions. The dichroic prism 1112 causes the light components having the R and B colors to be refracted by 90° and the light component having the G color to go straight. Thus, images, each having one of the three primary colors, are synthesized, such that a color image is projected onto a screen or the like through a projection lens 1114.

Here, in display images formed on the respective liquid crystal panels 1110R, 1110B, and 1110G, it is necessary that the display image formed on the liquid crystal panel 1110G be left and right inverted with respect to the display image formed on the liquid crystal panels 1110R and 1110B.

Further, since the light components corresponding to the primary colors of R, G, and B are respectively incident on the liquid crystal panels 1110R, 1110B, and 1110G by the dichroic mirrors 1108, it is not necessary to prepare a color filter.

Figure 12:
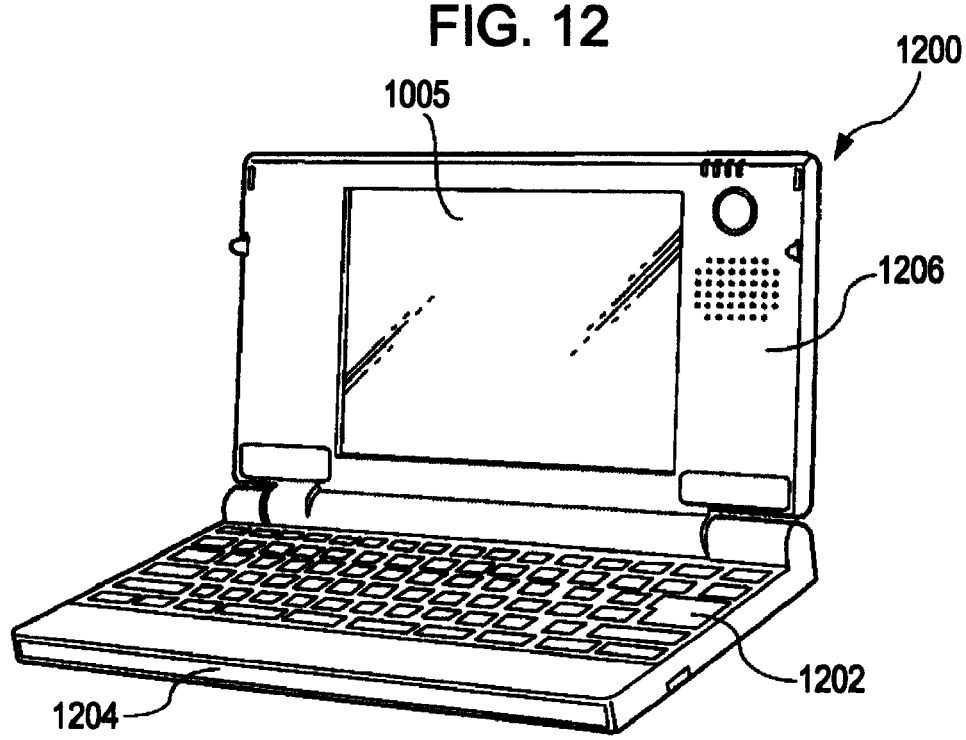
FIG. 12 is a plan view illustrating the configuration of a personal computer, which is an example of an electronic apparatus, to which the electro-optical device is applied.

Next, a case in which the liquid crystal device is applied to a mobile personal computer will be described. FIG. 12 is a perspective view illustrating the configuration of a personal computer. Referring to FIG. 12, a computer 1200 includes a main body unit 1204 having a keyboard 1202, and a liquid crystal display unit 1206. The liquid crystal display unit 1206 includes a backlight provided on a bottom surface of a liquid crystal device 1005 described above.

Figure 13:
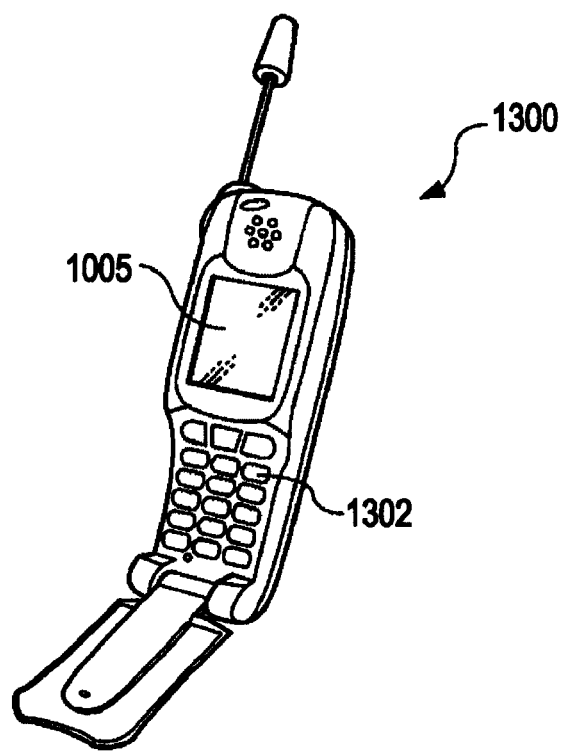
FIG. 13 is a plan view illustrating the configuration of a mobile phone, which is an example of an electronic apparatus, to which an electro-optical device is applied.

Furthermore, a case in which the liquid crystal device is applied to a mobile phone will be described. FIG. 13 is a perspective view illustrating the configuration of a mobile phone. Referring to FIG. 13, a mobile phone 1300 includes a plurality of operation buttons 1302 and a reflective liquid crystal device 1005. The reflective liquid crystal device 1005 may be provided with a frontlight on a front surface thereof as necessary.

Furthermore, the electro-optical device can be applied to various electronic apparatuses, such as a liquid crystal television, a viewfinder-type or monitor-direct-view-type video tape recorder, a car navigation device, a pager, an electronic organizer, an electronic calculator, a word processor, a workstation, a video phone, a POS terminal, a device having a touch panel, and the like, in addition to the electronic apparatuses described above with reference to FIGS. 11 to 13.

Furthermore, the invention can be applied to a reflective liquid crystal device (LCOS) in which elements are formed on a silicon substrate, a plasma display panel (PDP), field emission type display devices (FED, SED), an organic EL display device, a digital micromirror device (DMD), an electrophoresis apparatus, and the like, in addition to the liquid crystal device described in the above embodiments.

It should be understood that the invention is not limited to the above-described embodiments, but various modifications can be made within the scope without departing from the subject matter or spirit of the invention defined by the appended claims and the entire specification. Therefore, an electro-optical device, a method of manufacturing the same, an electronic apparatus having the electro-optical device, and a semiconductor device that accompany such modifications still fall within the technical scope of the invention.

The entire disclosure of Japanese Patent Application No. 2005-294429, filed Oct. 7, 2005, is expressly incorporated by reference herein.

What is claimed is:

1. A method of manufacturing an electro-optical device having a base insulating substrate, a plurality of pixel units provided in a display region on the base insulating substrate, first semiconductor elements driving the plurality of pixel units respectively in the display region, a peripheral region surrounding the display region, a driving circuit provided in the peripheral region on the base insulating substrate, and second semiconductor elements of the driving circuit driving the plurality of pixel units, the method comprising:

forming a semiconductor layer on the base insulating substrate in at least a region where each of the second semiconductor elements is to be disposed, the semiconductor layer having a silicon-on-insulator structure including a first single crystal silicon layer;

forming an amorphous silicon layer on the semiconductor layer and a region where each of the first semiconductor elements is to be disposed, wherein the amorphous silicon layer on the semiconductor layer and the region where each of the first semiconductor elements is to be disposed is on the base insulating substrate, and the amorphous silicon layer on the region where each of the first semiconductor elements is to be disposed is formed directly on the base insulating substrate; and heating the amorphous silicon layer so that the amorphous silicon layer on the semiconductor layer is converted into a second single crystal silicon layer by epitaxial growth and the amorphous silicon layer in the region where each of the first semiconductor elements is to be disposed is converted into a polysilicon layer.

* * * * *